(12) United States Patent
Mizuno

(10) Patent No.: US 6,546,038 B1
(45) Date of Patent: Apr. 8, 2003

(54) SEMICONDUCTOR SURFACE-EMITTING ELEMENT

(75) Inventor: Yoshiyuki Mizuno, Nagoya (JP)

(73) Assignee: Daido Tokushuko Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/537,411

(22) Filed: Mar. 29, 2000

(30) Foreign Application Priority Data

Apr. 15, 1999 (JP) .............................. 11-107866

(51) Int. Cl.[7] .............................. H01S 3/10; H01S 5/00; H01S 3/20; H01S 3/08
(52) U.S. Cl. .............................. 372/96; 372/43; 372/54; 372/20; 372/23
(58) Field of Search .............................. 372/96, 54, 23, 372/20

(56) References Cited

FOREIGN PATENT DOCUMENTS

| JP | 4-167484 | | 6/1992 |
|---|---|---|---|
| JP | 7-245449 | | 9/1995 |
| JP | 10-27945 | * | 1/1998 |
| JP | 10-027945 | | 1/1998 |

* cited by examiner

Primary Examiner—Paul Ip
Assistant Examiner—Armando Rodriguez
(74) Attorney, Agent, or Firm—Oblon, Spivak, McClelland, Maier & Neustadt, P.C.

(57) ABSTRACT

A semiconductor surface-emitting element having a light-emitting portion and formed of a plurality of semiconductor layers including a plurality of light-generating layers of a quantum well structure for generating lights having respective different emission spectra whose peak wavelengths are different from one another, and a light resonator consisting of a pair of reflecting layers between which the light-generating layers are interposed for reflecting the lights generated by the light-generating layers, so that a light resonated by the light resonator is emitted from the light-emitting portion. One of the light-generating layers which has an emission spectrum having the shortest peak wavelength is formed such that its peak wavelength is substantially equal to a resonance wavelength of the light resonator at the maximum operating temperature of the element, while another of the light-generating layers which has an emission spectrum having the longest peak wavelength is formed such that its peak wavelength is substantially equal to the resonance wavelength of the light resonator at the minimum operating temperature of the element.

8 Claims, 3 Drawing Sheets

SEMICONDUCTOR SURFACE-EMITTING ELEMENT

The present application is based on Japanese Patent Application No. 11-107866 filed Apr. 15, 1999, the contents of which are incorporated hereinto by reference.

BACKGROUND OF THE INVENTION

1. Field of the Invention

The present invention relates to an improvement of semiconductor surface-emitting elements such as a light-emitting diode (LED) and a vertical cavity surface-emitting laser (VCSE).

2. Discussion of the Related Art

There has been known a semiconductor surface-emitting element including a plurality of semiconductor layers which are laminated on a semiconductor substrate, wherein the plurality of semiconductor layers include at least one light-generating layer of a quantum well structure which generates a light and has a thickness value smaller than the wavelength (100 Å, i.e., 10 nm) of the electron wave, and a light resonator consisting of a pair of reflecting layers which are located on the opposite sides of the at least one light-generating layer, for reflecting the light generated by the at least one light-generating layer. By applying an electric current between two electrodes respectively formed on opposite two major surfaces of a laminar structure consisting of the plurality of semiconductor layers, the light generated by the at least one light-generating layer is emitted from one of the two opposite major surfaces of the laminar structure which is remote from the substrate. In the thus constructed semiconductor surface-emitting element called as a resonant-cavity light-emitting diode (RC-LED), for instance, the electron wave in the light-generating layer and the optical wave in the light resonator are coupled together, so that the at least one light-generating layer generates a light only in a resonance mode. This phenomenon is generally referred to as cavity QED effect. Owing to this cavity QED effect, the above-described semiconductor surface-emitting element is capable of emitting a light which has a high degree of directivity and a narrow line width, so that the emitted light does not suffer from total reflection on the crystal face, assuring a high degree of external quantum efficiency. One example of such a semiconductor element is disclosed in JP-A-4-167484.

The above-described semiconductor surface-emitting element having the light resonator in which there is disposed the at least one light-generating layer of a quantum well structure is capable of assuring a high degree of external quantum efficiency. This semiconductor surface-emitting element, however, emits a light in which a wavelength width over which the gain is obtained is relatively small. In other words, the wavelength width over which the gain ranging from 80% to 90% is obtained at a peak wavelength of an emission spectrum of the element is relatively small.

SUMMARY OF THE INVENTION

In the light-generating layer of a quantum well structure, the peak wavelength of its emission spectrum tends to vary with a change of the operating temperature of the semiconductor surface-emitting element. In this case, if the amount of change of the operating temperature of the surface-emitting element is relatively large, the resonance wavelength of the light resonator undesirably deviates from the wavelength range of the emission spectrum of the light-generating layer in which the gain is obtained. Accordingly, the operating temperature range wherein the semiconductor light-emitting element is operated is inevitably limited to a specific range in which the element emits a light having a desired emission wavelength. In view of this, there has been proposed another type of semiconductor surface-emitting element wherein a plurality of light-generating layers having different bandgap sizes, namely, different emission wavelengths, are provided within the light resonator. One example of such a semiconductor surface-emitting element is disclosed in JP-A-10-27945. The disclosed element generates an optical output with high stability even when the element is operated at a relatively high temperature since the disclosed element is capable of providing a certain level of gain irrespective of a rise of the operating temperature of the element.

However, the above-described publication merely discloses a semiconductor surface-emitting element which includes a plurality of light-generating layers having different emission wavelengths within the light resonator. In the thus constructed semiconductor surface-emitting element, the optical output of the element may fluctuate in the operating temperature range of the element, e.g., in the range of −40° C.~+105° C. Accordingly, the disclosed element does not always generate a stable optical output at any temperature value within the operating temperature range of the element.

The present invention was developed in the light of the above-described situation. It is therefore an object of the present invention to provide a semiconductor surface-emitting element having a light reflector in which there is disposed a plurality of light-generating layers of a quantum well structure, which semiconductor surface-emitting element is capable of generating an optical output with high stability within an operating temperature range of the element.

The above-described object of the present invention may be attained according to a principle of the invention, which provides a semiconductor surface-emitting element having a light-emitting portion and formed of a plurality of semiconductor layers including a plurality of light-generating layers of a quantum well structure for generating lights having respective different emission spectra whose peak wavelengths are different from one another, and a pair of reflecting layers between which the plurality of light-generating layers are interposed for reflecting the lights generated by the plurality of light-generating layers, the pair of reflecting layers functioning as a light resonator, the semiconductor surface-emitting element emitting a light resonated by the light resonator from the light-emitting portion, wherein the improvement comprises: one of the plurality of light-generating layers which has an emission spectrum having a shortest peak wavelength being formed such that the shortest peak wavelength is substantially equal to a light resonance wavelength of the light resonator at a predetermined maximum operating temperature of the semiconductor surface-emitting element, while another of the plurality of light-generating layers which has an emission spectrum having a longest peak wavelength being formed such that the longest peak wavelength is substantially equal to the light resonance wavelength of the light resonator at a predetermined minimum operating temperature of the semiconductor surface-emitting element.

In the semiconductor surface-emitting element constructed according to the present invention wherein the plurality of light-generating layers have respective different emission spectra whose peak wavelength are different from one another, the light-generating layer which has the emission spectrum having the shortest peak wavelength is formed such that the shortest peak wavelength is substantially equal to the light resonance wavelength of the light resonator at the predetermined maximum operating temperature of the semiconductor surface-emitting element, while the light-generating layer which has the emission spectrum having the longest peak wavelength is formed such that the longest peak wavelength is substantially equal to the light resonance wavelength of the light resonator at the predetermined minimum operating temperature of the element. In the thus constructed semiconductor surface-emitting element, the wavelength width of the light emitted from the element over which a gain is obtained is sufficiently large at any temperature value within the operating temperature range of the element, so that the surface-emitting element is capable of generating an optical output with high stability within the operating temperature range.

In one preferred form of the present invention, the plurality of light-generating layers are formed of the same compound semiconductor and have respective different thickness values. According to this arrangement, the plurality of light-generating layers having the respective different emission wavelengths are easily formed by controlling a time duration for which each light-generating layer is grown, such that each light-generating layer has the desired thickness value.

In another preferred form of the present invention, the plurality of light-generating layers have the same thickness value and are formed of respective compound semiconductors all of which consist of a same compound and which have respective different proportions of components of the compound. According to this arrangement, the plurality of light-generating layers having the respective different emission wavelengths can be easily formed by suitably controlling a switch valve device for adjusting the proportions of the components of the compound of the compound semiconductor which gives each light-generating layer during the crystal growing process of each light-generating layer.

In still another preferred form of the present invention, the pair of reflecting layers consists of a first reflecting layer and a second reflecting layer, the first reflecting layer consisting of a multiplicity of unit semiconductors which are formed by crystal growth on a monocrystalline GaAs substrate and which constitute a first distributed-Bragg reflector located on the side of the substrate, the plurality of light-generating layers of a quantum well structure including at least two light-generating layers each of which is interposed between two semiconductor barrier layers which are formed by crystal growth, the second reflecting layer consisting of a multiplicity of unit semiconductors which are formed by crystal growth on an upper one of the two barrier layers between which an uppermost one of the at least two light-generating layers is interposed, the multiplicity of unit semiconductors of the second reflecting layer constituting a second distributed-Bragg reflector located on the side of the light-emitting portion. According to this arrangement, the first reflecting layer, the barrier layers, the light-generating layers, and the second reflecting layer are grown on the substrate within a single processing chamber by suitably controlling a switch valve device.

In yet another preferred form of the present invention, the plurality of light-generating layers are formed in the semiconductor surface-emitting element such that each of the plurality of light-generating layers is aligned with a corresponding one of at least one antinode of a standing wave generated in the light resonator. This arrangement effectively increases the quantum efficiency of the surface-emitting element, resulting in a significantly high degree of light emission output of the element.

BRIEF DESCRIPTION OF THE DRAWINGS

The above and optional objects, features and advantages of the present invention will be better understood by reading the following detailed description of a presently preferred embodiment of the invention when considered in conjunction with the accompanying drawings in which.

DETAILED DESCRIPTION OF THE PREFERRED EMBODIMENT

Figure 1:
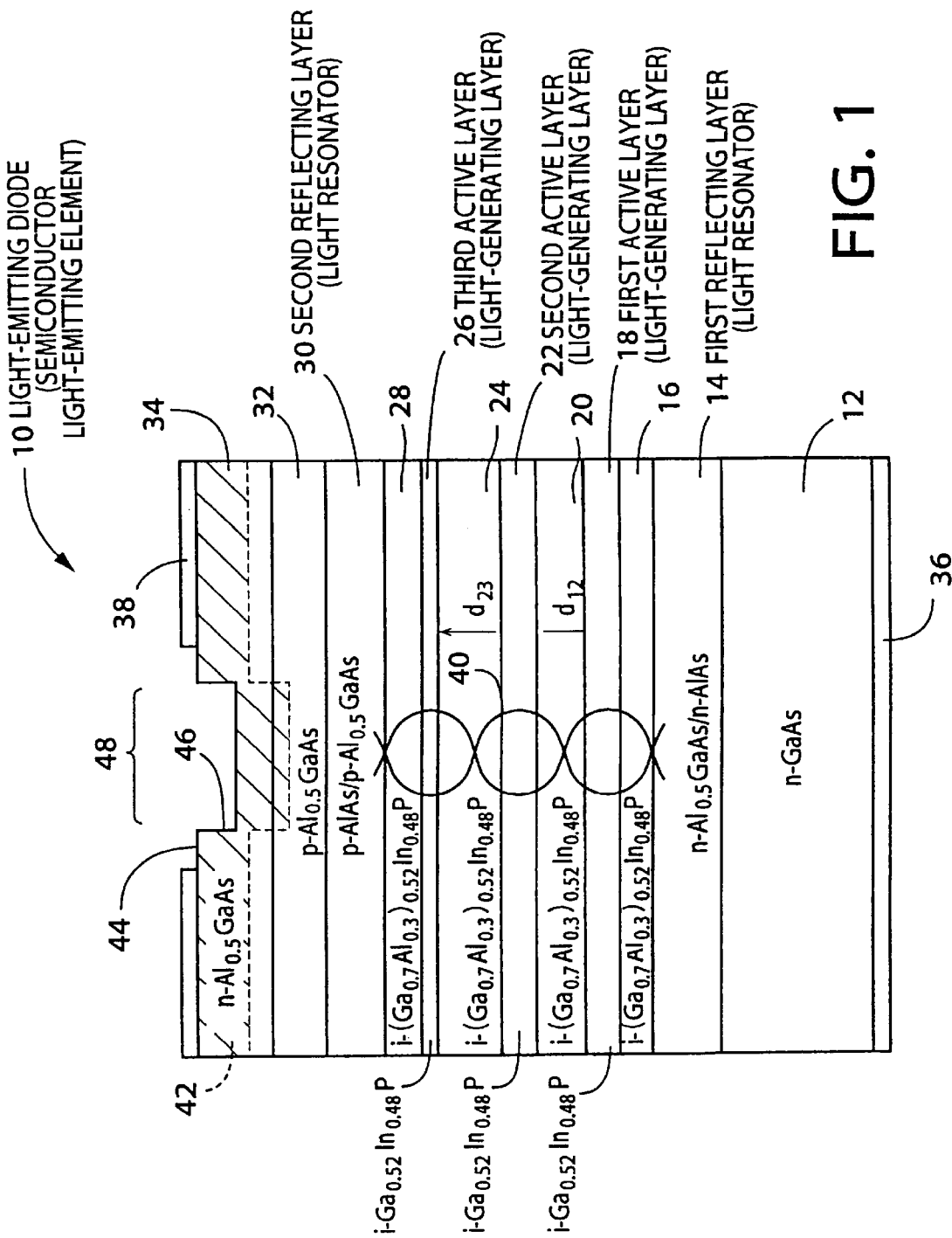
FIG. 1 is a view illustrating a semiconductor surface-emitting element in the form of a surface-emitting diode constructed according to one embodiment of the present invention.

Referring first to FIG. 1, there is shown a light resonant type semiconductor surface-emitting element in the form of a surface-emitting diode 10 (hereinafter referred to simply as "light-emitting diode") constructed according to one embodiment of the present invention. It is noted that the dimensions of the components of the light-emitting diode 10 are not necessarily accurately represented in FIG. 1. The light-emitting diode 10 takes the form of a chip cut from a semiconductor wafer, and includes a monocrystalline semiconductor substrate 12 and a plurality of semiconductor layers consisting of a first reflecting layer 14, a first barrier layer 16, a first active layer 18, a second barrier layer 20, a second active layer 22, a third barrier layer 24, a third active layer 26, a fourth barrier layer 28, a second reflecting layer 30, a cladding layer 32, and a current blocking layer 34, which are formed in the order of description on the substrate 12 by an epitaxial crystal growth technique such as Metal Organic Chemical Vapor Deposition (MOCVD). The light-emitting diode 10 further includes a lower electrode 36 and an upper electrode 38, which are formed by sputtering on the lower surface of the substrate 12 and the upper surface of the current blocking layer 34, respectively. The light-emitting diode 10 has a light-emitting portion 48 (which will be described) on one of its opposite ends which is remote from the substrate 12.

The substrate 12 is an n-type compound semiconductor formed of an n-GaAs single crystal and having a thickness of about 350 µm, for instance. The first reflecting layer 14 which is formed on the substrate 12 consists of a multiplicity of unit semiconductors, e.g., 30 pairs of unit semiconductors, each unit semiconductor consisting of an n-AlAs compound semiconductor monocrystalline film having a thickness of about 50 nm and an n-$Al_{0.5}Ga_{0.5}As$ compound semiconductor monocrystalline film having a thickness of about 44 nm. These two compound semiconductor films are alternately superposed on each other in this order on the substrate 12 so as to provide the multiplicity of unit semiconductors, so that the first reflecting layer 14 functions as an n-type distributed-Bragg reflector (DBR). The thickness values of the two compound semiconductor films of each unit semiconductor of the reflecting layer 14 are determined to be equal to about one fourth (¼) of the resonance wavelength of the light resonator which will be described.

The first through fourth barrier layers 16, 20, 24, 28 are i-$(GA_{0.7}Al_{0.3})_{0.52}I_{n0.48}P$ compound semiconductor monocrystalline layers, and are superposed on each other such that the adjacent two layers sandwich the corresponding one of the first, second, and third active layers 18, 22, 26 therebetween. The first and fourth barrier layers 16, 28 have a thickness value of about 45 nm while the second and third barrier layers 20, 24 have a thickness value of about 90 nm. In other words, a distance $d_{12}$ (FIG. 1) between the first and second active layers 18, 22 which corresponds to the thickness of the second barrier layer 20 and a distance $d_{23}$ (FIG. 1) between the second and third active layers 22, 26 which corresponds to the thickness of the third barrier layer 24 are about 90 nm, which value is equal to about one half (½) of the resonance wavelength of the light resonator.

The first, second, and third active layers 18, 22, 26 each of which is interposed between the corresponding adjacent two of the first through fourth barrier layers 16, 20, 24, 28 are quantum wells formed of i-$GA_{0.52}I_{n0.48}P$ compound semiconductor monocrystalline layers. The thickness values of the first through third active layers 18, 22, 26 are determined such that the active layers 18, 22, 26 provide the quantum wells whose energy levels are discontinuous with one another. For instance, the thickness values of the first, second, and third active layers 18, 22, 26 are about 6.8 nm, 4.9 nm, and 3.8 nm, respectively, which values are sufficiently smaller than the wavelength of the electron wave, i.e., 100 nm. Accordingly, the peak wavelengths of the emission spectra of the active layers 18, 22, 26 at the room temperature (10° C.) are about 636 nm, about 627 nm, and about 619 nm, respectively. In the present embodiment, the active layers 18, 22, 26 function as light-generating layers of a quantum well structure.

Like the first reflecting layer 14 on the side of the substrate 12, the second reflecting layer 30 on the side of the light-emitting portion 48 consists of a multiplicity of unit semiconductors, e.g., 10 pairs of unit semiconductors, each unit semiconductor consisting of a p-AlAs compound semiconductor monocrystalline film having a thickness of about 50 nm and a p-$Al_{0.5}Ga_{0.5}As$ compound semiconductor monocrystalline film having a thickness of about 44 nm. These two compound semiconductor films are alternately superposed on each other so as to provide the multiplicity of unit semiconductors, so that the second reflecting layer 30 functions as a p-type distributed-Bragg reflector (DBR). In the present embodiment, the pair of reflecting layers 14, 30 constitutes a light resonator, and a distance between the two layers 14, 30, in other words, a length L of the light resonator is about 945 nm, as measured when the light resonator is in vacuum wherein the refractive index n=1. The length L (=945 nm) of the light resonator is about 1.5 times the peak wavelength (=630 nm) of the spectrum of a composite light which is composed of the lights generated by the active layers 18, 22, 26 and which is emitted from the light-emitting portion 48. According to this arrangement, the lights generated by the active layers 18, 22, 26 are repeatedly reflected by and between the first and second reflecting layers 14, 30, to thereby produce a standing wave 40, as shown in FIG. 1. Since the length L of the light resonator and the thickness values of the first through fourth barrier layers 16, 20, 24, 28 are determined as described above, the active layers 18, 22, 26 are aligned with respective antinodes of the standing wave 40, as shown in FIG. 1. In the present embodiment wherein the semiconductor layers (16–28) within the light resonator (14, 30) are substantially formed of a compound semiconductor of GaAlInP, the diffusion length of the carriers (electrons or holes) in the light resonator is about 0.5 µm, and the coherent length of the electrons is about 50 nm. In this arrangement, the distance $d_{12}$ (90 nm) between the first and second active layers 18, 22 and the distance $d_{23}$ (90 nm) between the second and third active layers 22, 26 are sufficiently smaller than the diffusion length of the carriers, and sufficiently larger than the coherent length of the electrons.

The cladding layer 32 is a p-$Al_{0.5}Ga_{0.5}As$ compound semiconductor monocrystalline layer having a thickness value of about 2 µm while the current blocking layer 34 is an n-$Al_{0.5}Ga_{0.5}As$ compound semiconductor monocrystalline layer having a thickness value of about 1 µm. Portions of the cladding layer 32 and the current blocking layer 34 indicated by hatched lines in FIG. 1 are doped with a p-type dopant impurity such as Zn, to thereby form a diffusion area 42 in which the impurity is diffused in a high concentration. In this diffusion area 42, the conductivity of the cladding layer 32 is increased while the polarity of the current blocking layer 34 is changed to the p-type. In the thus formed light-emitting diode 10, there is formed a narrow or restricted current flow path in a central portion of the current blocking layer 34, in which the p-type impurity is diffused to change the polarity from the n-type into the p-type, over the entire thickness down to the interface with the cladding layer 32. The electric current can flow through only this narrow current flow path of the current blocking layer 34 when the diode 10 is energized.

The lower electrode 36 has a thickness of about 1 µm and is formed of a laminar structure consisting of a Au—Ge alloy, Ni and Au which are superposed on one another in the order of description on the substrate 12, so as to cover the entirety of the lower surface of the substrate 12. The upper electrode 38 has a thickness of about 1 µm and is formed of a laminar structure consisting of a Au—Zn alloy and Au which are superposed on each other in the order of description on the upper surface 44 of the current blocking layer 34 except a circular central portion corresponding to the width of the above-described narrow current flow path. The lower and upper electrodes 36, 38 are ohmic electrodes.

The circular central portion of the current blocking layer 34 on which the upper electrode 38 is not provided is formed with a recess 46 having a diameter of about 50 µm. The lights generated by the light-generating layers are emitted from the light-emitting portion 48 corresponding to this recess 46. The bottom of the recess 46 defines the upper end of the above-described narrow current flow path, the diameter of which is equal to that of the light-emitting portion 48. The recess 46 is formed by etching, for instance, for the purpose of increasing the depth of diffusion of the impurity into the central portion of the current blocking layer 34 through its upper surface 44 down into the cladding layer 32.

The light-emitting diode 10 described above is produced in the following manner, for instance. Initially, all layers from the first reflecting layer 14 through the current blocking layer 34 are formed by crystal growth on the substrate 12 by the MOCVD method, for instance, so as to form an epitaxial wafer. Then, a resist is applied to cover the upper surface 44 of the current blocking layer 34 except the circular central portion having the diameter of 50 µm. The surface 44 is subjected to an etching operation by using an etching liquid consisting of ammonium and an aqueous solution of hydrogen peroxide, whereby the circular central portion of the current blocking layer 34 which is not covered by the resist is etched so as to form the above-described recess 46.

After the resist is removed from the surface 44 of the current blocking layer 34, Zn as the dopant impurity is diffused in the current blocking layer 34 by thermal diffusion such as a sealed tube diffusion method. More specifically described, in the outer peripheral portion of the current blocking layer 34 which has the original thickness, namely the portion wherein the recess 46 is not formed, only an upper half thickness portion of the current blocking layer 34 is doped with the Zn. In the circular central portion of the current blocking layer 34 wherein the recess 46 is formed by etching, the Zn is diffused down into an upper half thickness portion of the cladding layer 32, beyond the boundary between the current blocking layer 34 and the cladding layer 32, so that the circular central portion of the current blocking layer 34 is doped with the Zn through the entire thickness thereof, so as to provide the above-described narrow current flow path. Thus, there is formed the diffusion area 42 in which the Zn is diffused in a high concentration. In effecting the thermal diffusion of the Zn, the epitaxial wafer is put into a quarts ampul together with a diffusion source (e.g., $ZnAs_2$), and the ampul is sealed in vacuum. Then, the ampul is heated in an electric furnace and held at about 600° C. for twenty-four hours. After the lower and upper electrodes 36, 38 are formed on the lower surface of the substrate 12 and the upper surface of the current blocking layer 34, respectively, the epitaxial wafer is cut by dicing into a plurality of pieces corresponding to the individual light-emitting diodes 10. The obtained light-emitting diode 10 is die-bonded to a TO18 flat stem not shown while it is sealed. In this state, the lo light-emitting diode 10 is operated by applying a positive voltage to the upper electrode 38 and a negative voltage to the lower electrode 36.

Figure 2:
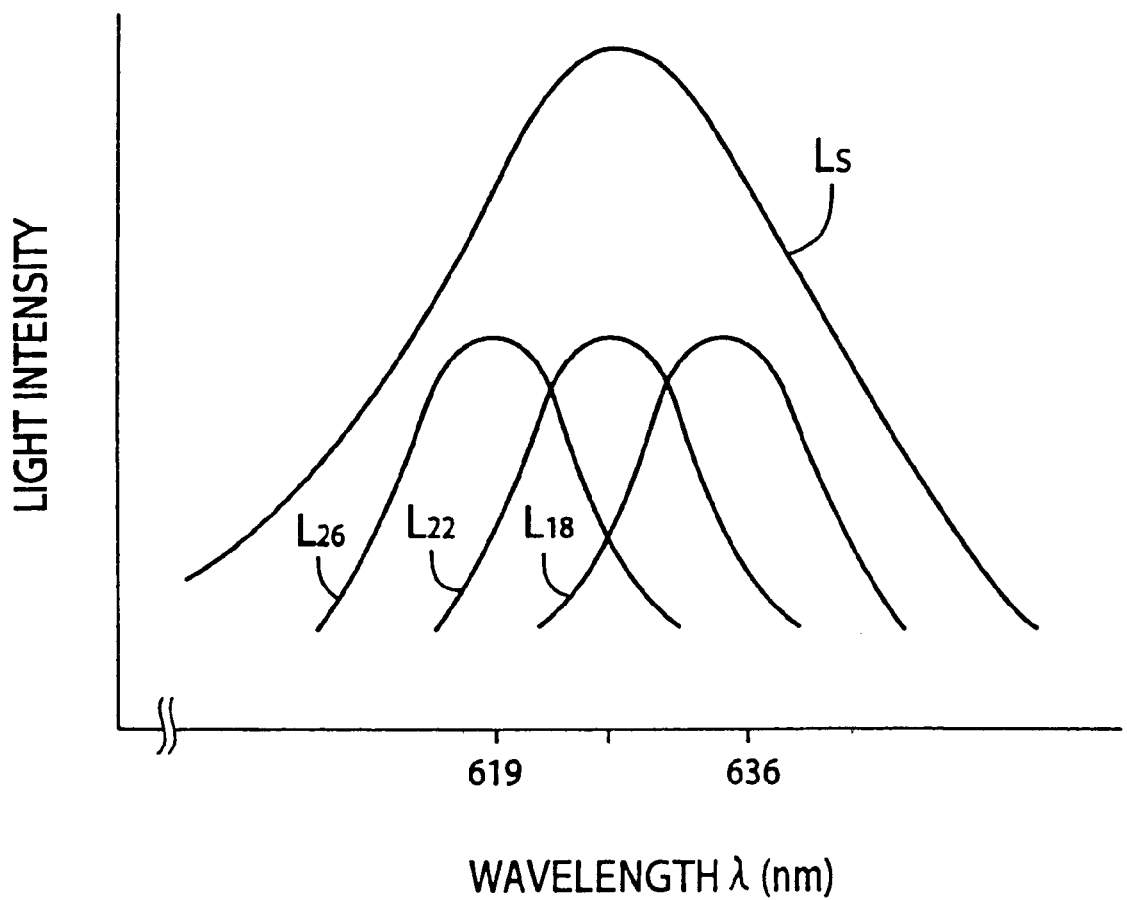
FIG. 2 is a graph showing a gain spectrum of the light-emitting diode of FIG. 1, i.e., a composite spectrum $L_s$ which is composed of three emission spectra $L_{18}$, $L_{22}$, $L_{26}$ of the respective three active layers, as compared with those emission spectra $L_{18}$, $L_{22}$, $L_{26}$ of the active layers.

In the present light-emitting diode 10, with a voltage applied between the lower electrode 36 and the upper electrode 38, an electric current flows in a direction from the upper portion to the lower portion of the diode through the narrow current flow path as described above, so that the active layers 18, 22, 26 are excited to generate lights. Since the light-generating layers in the form of the active layers 18, 22, 26 formed of respective different quantum wells are disposed within the light resonator (microresonator) constituted by the pair of reflecting layers 14, 30, each of the active layers 18, 22, 26 generates a light having a relatively small width of emission spectrum at the wavelength which satisfies the resonance condition. In the present light-emitting diode 10 wherein the light-generating layers, i.e., the active layers 18, 22, 26 are formed of the respective different quantum wells having respective different thickness values, the peak wavelengths of the lights generated by the respective active layers 18, 22, 26 are different from one another as shown in the graph of FIG. 2. Accordingly, the emission spectrum $L_s$ of the composite light which is composed of the lights generated by the active layers 18, 22, 26 and which is emitted from the light-emitting portion 48 consists of a combination of the emission spectra $L_{18}$, $L_{22}$, $L_{26}$ of the lights generated by the respective active layers 18, 22, 26 (light-generating layers), which emission spectra $L_{18}$, $L_{22}$, $L_{26}$ are superimposed on one another, so that the wavelength width over which the gain is obtained is larger in the emission spectrum $L_s$ of the composite light emitted from the emitting portion 48 than that in each emission spectrum $L_{18}$, $L_{22}$, $L_{26}$ of each active layer (light-generating layer).

The peak wavelength of the composite light whose emission spectrum $L_s$ consists of the combination of the three emission spectra $L_{18}$, $L_{22}$, $L_{26}$ of the respective three active layers 18, 22, 26, i.e., the peak value in the wavelength range in which the gain is obtained, is in the neighborhood of the resonance wavelength of the light resonator, namely, about 630 nm, at the room temperature.

In the present light-emitting diode 10 wherein the active layers 18, 22, 26 are formed of the same compound semiconductor, namely, the i-$Ga_{0.52}In_{0.48}P$ single crystal, and have the respective different thickness values (i.e., 6.8 nm, 4.9 nm, 3.8 nm), the peak wavelengths of the emission spectra $L_{18}$, $L_{22}$, $L_{26}$ of the respective active layers 18, 22, 26 at the room temperature (10° C.) are about 636 nm, about 627 nm, and about 619 nm, respectively. Described more specifically, the peak wavelengths of the active layers 18, 22, 26 at the room temperature are determined by adjusting the respective thickness values of the active layers 18, 22, 26, such that the peak wavelength of the emission spectrum $L_{26}$ of the active layer 26 is substantially equal to the resonance wavelength (630 nm) of the above-described light resonator at the maximum operating temperature $T_{max}$ of the light-emitting diode 10, and such that the peak wavelength of the emission spectrum $L_{18}$ of the active layer 18 is substantially equal to the resonance wavelength (630 nm) of the light resonator at the minimum operating temperature $T_{min}$ of the diode 10.

Figure 3:
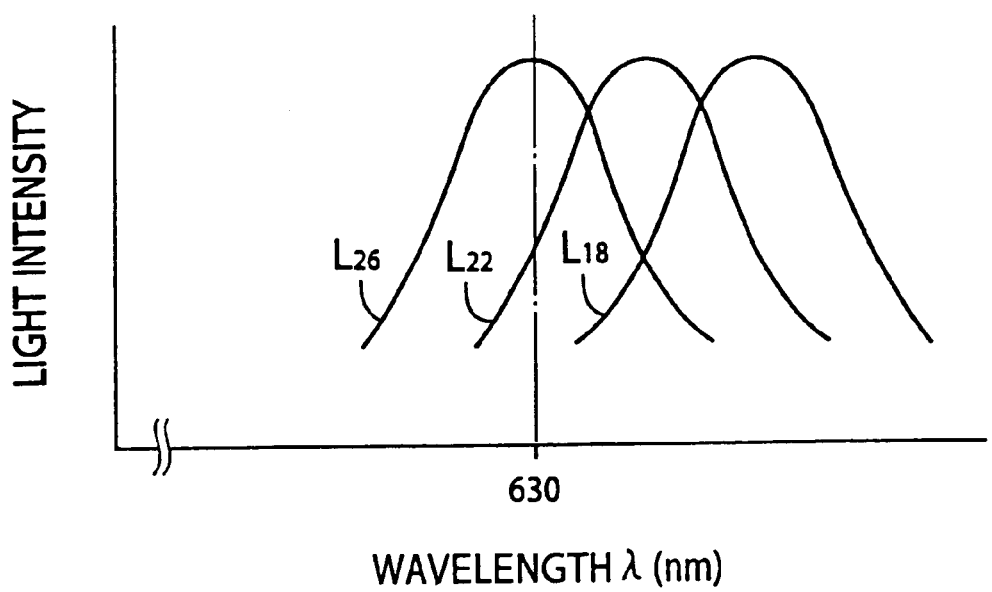
FIG. 3 is a graph showing the emission spectra $L_{18}$, $L_{22}$, $L_{26}$ of the three active layers at the predetermined maximum operating temperature of the light-emitting diode, in comparison with the resonance wavelength (630 nm)
Figure 4:
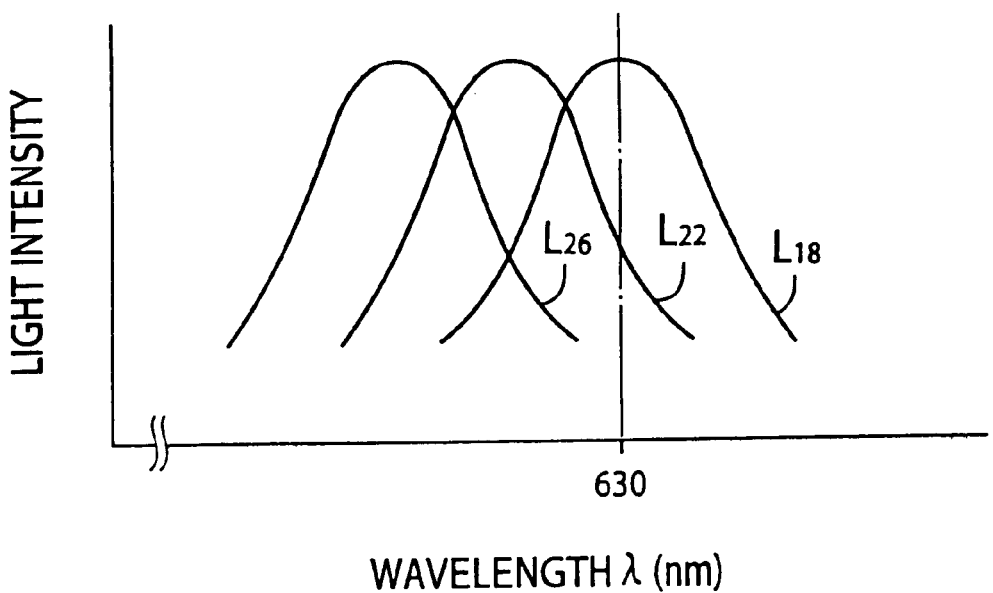
FIG. 4 is a graph showing the emission spectra $L_{18}$, $L_{22}$, $L_{26}$ of the three active layers at the predetermined minimum operating temperature of the light-emitting diode, in comparison with the resonance wavelength (630 nm).

The above-described maximum operating temperature $T_{max}$ is an upper limit of the temperature range in which the light-emitting diode 10 is operated, which upper limit is predetermined to assure or maintain the performance of the light-emitting diode 10. The maximum operating temperature $T_{max}$ corresponds to the highest value of an operating temperature $T_a$ at which the light-emitting diode 10 is operated, e.g., 105° C., or the highest value of a junction temperature $T_j$ in the semiconductor chip of the diode 10, e.g., 120° C. Similarly, the above-described minimum operating temperature $T_{min}$ is a lower limit of the temperature range in which the light-emitting diode 10 is operated, which lower limit is predetermined to assure or maintain the performance of the light-emitting diode 10. The minimum operating temperature $T_{min}$ corresponds to the lowest value of the operating temperature $T_a$ of the diode 10, e.g., -40° C., or the lowest value of the junction temperature $T_j$ in the semiconductor chip of the diode 10, e.g., -25° C. As shown in the following partial differential equation (1), a temperature shift $\partial\lambda/\partial T$ of the emission wavelength $\lambda$ of each active layer 18, 22, 26 tends to increase with an increase of the operating temperature of the light-emitting diode 10. When the active layers 18, 22, 26 are formed of the compound semiconductor single crystal of i-$Ga_{0.52}In_{0.48}P$, a ratio $\partial\lambda/\partial T_j$ of an amount of change of the emission wavelength of each active layer 18, 22, 26 to an amount of change of the operating temperature of the diode 10 is calculated at 0.12 nm/° C. from the equation (1). Accordingly, if the light-emitting diode 10 is operated at the maximum operating temperature $T_{max}$, the peak wavelength of the emission spectrum $L_{26}$ of the active layer 26, which peak wavelength is the shortest of the three peak wavelength values of the emission spectra of the three active layers 18, 22, 26, is increased from the value (619 nm) at the room temperature up to 630 nm, so that the creased peak wavelength of the emission spectrum $L_{26}$ is substantially equal to the resonance wavelength (630 nm) of the above-described light resonator, as shown in the graph of FIG. 3. Similarly, if the light-emitting diode 10 is operated at the minimum operating temperature $T_{min}$, the peak wavelength of the emission spectrum $L_{18}$ of the active layer 18, which peak wavelength is the longest of those of the emission spectra of the three active layers 18, 22, 26, is decreased from the value (636 nm) at the room temperature down to 630 nm, so that the decreased peak wavelength of the emission spectrum $L_{18}$ is substantially equal to the resonance wavelength (630 nm) of the light resonator, as shown in the graph of FIG. 4. In the following equation (1), h, c, and $E_g$ represent a Planck's constant, a luminous flux, and a bandgap size of the material of the quantum wells, respectively.

$$\partial\lambda/\partial T = -(hc/E_g^2)(\partial E_g/\partial T) = -(\lambda_2/hc)(\partial E_g/\partial T) \tag{1}$$

In the present light-emitting diode 10, the active layer 26, which has the emission spectrum $L_{26}$ having the shortest peak wavelength is formed such that the shortest peak wavelength is substantially equal to the light resonance wavelength (630 nm) of the light resonator at the predetermined maximum operating temperature $T_{max}$ of the light-emitting diode 10, while the active layer 18 which has the emission spectrum $L_{18}$ having the longest peak wavelength is formed such that the longest peak wavelength is substantially equal to the light resonance wavelength of the light resonator at the predetermined minimum operating temperature $T_{min}$ of the light-emitting diode 10. According to this arrangement, the wavelength width of the light emitted by the light-emitting diode 10 over which the gain is obtained is sufficiently large at any temperature value within the operating temperature range of the diode 10, so that the light-emitting diode 10 is capable of generating an optical output with high stability in its operating temperature range.

In the present light-emitting diode 10, the active layers 18, 22, 26 are formed of the same compound semiconductor single crystal of i-$Ga_{0.52}In_{0.48}P$, and have the respective different thickness values, so that the active layers 18, 22, 26 have the respective different emission spectra whose peak wavelength are different from one another. In this arrangement, the active layers 18, 22, 26 having the respective different emission spectra can be easily formed by suitably controlling the time duration for which each of the active layers 18, 22, 26 is grown, such that each active layer 18, 22, 26 has the desired thickness value.

The light-emitting diode 10 of the present embodiment includes the monocrytalline GaAs substrate 12, the first reflecting layer 14 consisting of a multiplicity of unit semiconductors which are formed by crystal growth on the substrate 12 and which constitute the first distributed-Bragg reflector located on the side of the substrate, at least two active layers 18, 22, 26 of a quantum well structure each of which is interposed between adjacent two semiconductor barrier layers 16, 20, 24, 28 which are formed by crystal growth, and the second reflecting layer 30 consisting of a multiplicity of unit semiconductors which are formed by crystal growth on the uppermost barrier layer 28 and which constitute the second distributed-Bragg reflector 30 located on the side of the light-emitting portion 48. In the thus constructed light-emitting diode 10, the first reflecting layer 14, the barrier layers 16, 20, 24, 28, the light-generating layers 18, 22, 26, and the second reflecting layer 30 are grown on the substrate within a single processing chamber by suitably controlling a switch valve device.

In the present embodiment, the active layers 18, 22, 26 are formed in the light-emitting diode 10 such that each of the active layers 18, 22, 26 is aligned with a corresponding one of at least one antinode of the standing wave 40 generated in the light resonator. This arrangement effectively increases the quantum efficiency of the light-emitting diode, resulting in a significantly high degree of light emission output of the diode.

While the present invention has been described in its preferred embodiment, the invention may be otherwise embodied.

In the illustrated embodiment, the active layers 18, 22, 26 are formed of the same compound semiconductor single crystal of i-$Ga_{0.52}In_{0.48}P$, and have the respective different thickness values, so that the active layers 18, 22, 26 have the respective emission spectra having the respective different peak wavelength values. However, the active layers 18, 22, 26 may have same thickness value, and be formed of respective compound semiconductors all of which consist of a same compound and which have respective different proportions of components (elements) of the compound, so that the active layers 18, 22, 26 have the respective emission spectra whose peak wavelengths are different from one another. According to this arrangement, the active layers 18, 22, 26 having the respective different emission wavelengths can be easily formed by suitably controlling the switch valve device for adjusting the proportions of the components of the compound during the crystal growth of each active layer.

While the light-emitting diode 10 in the illustrated embodiment has the three active layers 18, 22, 26 formed of the quantum wells, each of the active layers 18, 22, 26 being sandwiched by and between the corresponding two of the first through fourth barrier layers 16, 20, 24, 28, the number of the active layers is not limited to that in the illustrated embodiment. The light-emitting diode 10 may have only two active layers. Alternatively, the light-emitting diode 10 may have four or more active layers. Further, two or more active layers may be provided in alignment with the respective antinodes of the standing wave 40 generated in the light resonator.

The distance between the adjacent two active layers are not limited to about one half of the resonance wavelength as in the illustrated embodiment, but may be suitably changed as long as it is longer than the coherent length of the electrons. For permitting the light-emitting diode 10 to exhibit the emission efficiency as high as possible, the distance between the adjacent two active layers is preferably shorter than the diffusion length of the carriers. More preferably, the distance between the adjacent two active layers is about one half of the resonance wavelength.

The light-emitting diode in the illustrated embodiment has an InAlGaAs structure wherein the semiconductor layers such as the active layer 18 is formed of the $Ga_{0.52}In_{0.48}P$ compound semiconductor. The principle of the present invention is applicable to other types of light-emitting diode wherein the semiconductor layers are formed of an AlGaAs single crystal, a GaAsP single crystal or an InGaAsP single crystal.

In the illustrated embodiment, the pair of reflecting layers consists of the first and second reflecting layers 14, 30 which are formed of the respective multilayered semiconductor reflecting layers. The pair of reflecting layers may consist of dielectric layers or metallic layers.

The light-emitting diode 10 of the illustrated embodiment is a point light source type diode wherein the generated light is emitted from only the light-emitting portion 48 formed at the central portion of the upper surface 44 of the current blocking layer 34. The principle of the present invention is applicable to other diodes such as a surface emitting diode wherein the generated light is emitted from the entire surface of the upper surface 44.

In the light-emitting diode 10 of the illustrated embodiment, each active layer 18, 22, 26 has the desired peak wavelength of the emission spectrum at the room temperature by suitably adjusting the thickness of each active layer, such that the peak wavelength of the emission spectrum $L_{26}$ of the active layer 26 is substantially equal to the resonance wavelength (630 nm) of the light resonator at the maximum operating temperature $T_{max}$ of the light-emitting diode 10, and such that the peak wavelength of the emission spectrum $L_{18}$ of the active layer 18 is substantially equal to the resonance wavelength (630 nm) of the light resonator at the minimum operating temperature $T_{min}$ of the diode 10. The peak wavelengths of the emission spectra $L_{18}$, $L_{26}$ of the active layers 18, 26 may be completely equal to the resonance wavelength of the light resonator. Alternatively, the peak wavelengths may slightly deviate from the resonance wavelength as long as the gain not smaller than 80% is obtained in each of the emission spectra $L_{18}$, $L_{26}$ of the active layers 18, 26.

While the light-emitting diode 10 has been described as one embodiment of the invention, the principle of the present invention is applicable to other semiconductor surface-emitting elements such as a vertical cavity surface-emitting laser (VCSEL).

It is to be understood that the present invention may be embodied with various changes, modifications and improvements that may occur to those skilled in the art without departing from the scope and spirit of the invention defined by the appended claims.

What is claimed is:

1. A semiconductor surface-emitting element having a light-emitting portion and formed of a plurality of semiconductor layers including a plurality of light-generating layers of a quantum well structure for generating lights having respective different emission spectra whose peak wavelengths are different from one another, and a pair of reflecting layers between which said plurality of light-generating layers are interposed for reflecting said lights generated by said plurality of light-generating layers, said pair of reflecting layers functioning as a light resonator, said semiconductor surface-emitting element emitting a light resonated by said light resonator from said light-emitting portion, wherein the improvement comprises:

a first of said plurality of light-generating layers formed of a first predetermined thickness which corresponds to an emission spectrum having a shortest peak wavelength such that said shortest peak wavelength is substantially equal to a light resonance wavelength of said light resonator at a predetermined maximum operating temperature of said semiconductor surface-emitting element, so that said shortest peak wavelength is substantially equal to said light resonance wavelength of said light resonator at said predetermined maximum operating temperature, while a second of said plurality of light-generating layers is formed of a second predetermined thickness which corresponds to an emission spectrum having a longest peak wavelength such that said longest peak wavelength is substantially equal to said light resonance wavelength of said light resonator at a predetermined minimum operating temperature of said semiconductor surface-emitting element, so that said longest peak wavelength is substantially equal to said light resonance wavelength of said light resonator at said predetermined minimum operating temperature.

2. A semiconductor surface-emitting element according to claim 1, wherein said plurality of light-generating layers are formed of the same compound semiconductor and have respective different thickness values.

3. A semiconductor surface-emitting element according to claim 1, wherein said pair of reflecting layers include a first reflecting layer and a second reflecting layer, said first reflecting layer including a multiplicity of unit semiconductors which are formed by crystal growth on a monocrystalline GaAs substrate and which constitute a first distributed-Bragg reflector located on the side of said substrate, said plurality of light-generating layers of a quantum well structure including at least two light-generating layers each of which is interposed between two semiconductor barrier layers which are formed by crystal growth, said second reflecting layer including a multiplicity of unit semiconductors which are formed by crystal growth on an upper one of said two barrier layers between which an uppermost one of said at least two light-generating layers is interposed, said multiplicity of unit semiconductors of said second reflecting layer constituting a second distributed-Bragg reflector located on the side of said light-emitting portion.

4. A semiconductor surface-emitting element according to claim 1, wherein said plurality of light-generating layers are formed in said semiconductor surface-emitting element such that each of said plurality of light-generating layers is aligned with a corresponding one of at least one antinode of a standing wave generated in said light resonator.

5. A semiconductor surface-emitting element according to claim 1, wherein said predetermined maximum operating temperature of said semiconductor surface-emitting element is 105° C. in terms of the operating temperature at which said semiconductor surface-emitting element is operated, and 120° C. in terms of a junction temperature in a semiconductor chip of said semiconductor surface-emitting element.

6. A semiconductor surface-emitting element according to claim 1, wherein said predetermined minimum operating temperature of said semiconductor surface-emitting element is −40° C. in terms of the operating temperature at which said semiconductor surface-emitting element is operated, and −25° C. in terms of a junction temperature in a semiconductor chip of said semiconductor surface-emitting element.

7. A semiconductor surface-emitting element according to claim 1, wherein said plurality of light-generating layers includes a first, a second, and a third light-generating layer, the peak wavelengths of said emission spectra of said first, second, and third light-generating layers at the room temperature are about 636 nm, about 627 nm, and about 619 nm, respectively.

8. A semiconductor surface-emitting element according to claim 1, wherein each of said plurality of light-generating layers is a GaInP compound semiconductor monocrystalline layer.

* * * * *